United States Patent
Fujiwara et al.

(10) Patent No.: US 10,892,008 B2
(45) Date of Patent: Jan. 12, 2021

(54) MULTI WORD LINE ASSERTION

(71) Applicant: Taiwan Semiconductor Manufacturing Company, Ltd., Hsinchu (TW)

(72) Inventors: Hidehiro Fujiwara, Hsinchu (TW); Hsien-Yu Pan, Hsinchu (TW); Chih-Yu Lin, Hsinchu (TW); Yen-Huei Chen, Hsinchu (TW); Wei-Chang Zhao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/434,746

(22) Filed: Jun. 7, 2019

(65) Prior Publication Data

US 2019/0385671 A1 Dec. 19, 2019

Related U.S. Application Data

(60) Provisional application No. 62/685,547, filed on Jun. 15, 2018.

(51) Int. Cl.
*G11C 11/418* (2006.01)

(52) U.S. Cl.
CPC .................. *G11C 11/418* (2013.01)

(58) Field of Classification Search
None
See application file for complete search history.

(56) References Cited

U.S. PATENT DOCUMENTS

| | | | |
|---|---|---|---|
| 7,379,349 B2 | 5/2008 | Motomochi | |
| 7,451,363 B2 | 11/2008 | Kurumada et al. | |
| 7,885,138 B2 | 2/2011 | Kim et al. | |
| 9,691,502 B2 | 6/2017 | Sano et al. | |
| 2005/0165995 A1 | 7/2005 | Gemelli et al. | |
| 2009/0103390 A1* | 4/2009 | Kim | G11C 8/16 365/230.05 |
| 2014/0010027 A1 | 1/2014 | Fujiwara | |
| 2014/0085993 A1* | 3/2014 | Tao | G11C 7/08 365/194 |
| 2016/0049182 A1 | 2/2016 | Katoch et al. | |
| 2017/0186483 A1 | 6/2017 | Singh et al. | |

FOREIGN PATENT DOCUMENTS

| | | |
|---|---|---|
| CN | 1423284 A | 6/2003 |
| CN | 1577634 A | 2/2005 |
| CN | 106611622 A | 5/2017 |

OTHER PUBLICATIONS

Kim et al., "A Folded Bit-Line Architecture for High Speed SMOS SRAM," 6th International Conference on VLSI and CAD, pp. 553-556 (1999).

* cited by examiner

*Primary Examiner* — James G Norman
(74) *Attorney, Agent, or Firm* — Merchant & Gould P.C.

(57) ABSTRACT

A memory macro system may be provided. The memory macro system may comprise a first segment, a second segment, a first WL, and a second WL. The first segment may comprise a first plurality of memory cells. The second segment may comprise a second plurality of memory cells. The first segment may be positioned over the second segment. The first WL may correspond to the first segment and the second WL may correspond to the second segment. The first WL and the second WL may be configured to be activated in one cycle.

19 Claims, 8 Drawing Sheets

FIG. 6

MULTI WORD LINE ASSERTION

CROSS-REFERENCE TO RELATED APPLICATIONS

This application claims the benefit of U.S. Provisional Application No. 62/685,547 filed on Jun. 15, 2018, and entitled "SRAM MEMORY", of which the entire disclosure is hereby incorporated by reference in its entirety.

BACKGROUND

Semiconductor memory is an electronic data storage device implemented on a semiconductor-based integrated circuit. Semiconductor memory has many different types, and has faster access times than other data storage technologies. For example, a byte of data can often be written to or read from semiconductor memory within a few nanoseconds, while access times for rotating storage, such as hard disks, is in the range of milliseconds. For these reasons, among others, semiconductor memory is used as a primary storage mechanism for computers to hold data that the computers are currently working on, among other uses.

Semiconductor memory devices include, for example, Static Random Access Memory (SRAM) cells and Dynamic Random Access Memory (DRAM) cells. DRAM memory cells have only one transistor and one capacitor, so it provides a high degree of integration. DRAM requires constant refreshing. Also, its power consumption and slow speed limit its use mainly for computer main memories. An SRAM cell, on the other hand, is bistable, meaning it can maintain its state indefinitely as long as an adequate power is supplied. SRAM can operate at a higher speed and lower power dissipation, so computer cache memories use SRAMs. Other applications include embedded memories and networking equipment memories. There are several types of SRAM cells (e.g., 6-transistor (6T) SRAM, dual port 8-transistor (8T) SRAM, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

SRAM is a type of semiconductor memory that stores data in the form of bits using bistable circuitry without the need for refreshing. An SRAM cell may be referred to as a bit cell because it stores a bit of information. Memory arrays may include multiple bit cells arranged in rows and columns. Each bit cell in a memory array may include connections to a power supply voltage and to a reference voltage. Bit Lines (BLs) may be used for accessing a bit cell with a Word Line (WL) controlling connections to the BLs. A WL may be coupled to the bit cells in a row of a memory array with different WLs provided for different rows.

One type of semiconductor memory is a Dual-Port (DP) SRAM. A DP SRAM allows two memory accesses to occur at the same time, or at nearly the same time, respectively through two "ports". The DP SRAM may comprise one or more banks of memory cells where each bank of memory cells comprises a plurality of memory cells arranged in rows and columns. Two word lines may correspond to the two ports and extend along each row, electrically coupling with each memory cell in the row. Two pair of Complementary BLs (CBLs) may correspond to the two ports and extend along each column electrically coupling with each memory cell in the column. The WLs of each port may allow access to the memory cells on a row-by-row basis, and the CBLs of each port may allow data states to be written to or read from accessed memory cells on a column-by-column basis.

As memory devices get larger, longer WLs may be needed. Longer WLs may degrade the speed of the memory device. For example, if an SRAM multiplexer is greater than eight cells, the height of an Input/Output (IO) cell may tend to be shorter than a control block that could lead to an aspect ratio that may cause layout difficulty and wasted area on a chip. Such an aspect ratio may not be good for placement in the chip. Because the bit cell width may be larger than the bit cell height, the width of a macro containing the memory device may tend to be larger than the macro's height.

Embodiments of the disclosure, for example, may split a conventional 256×288 memory device into two 256×144 segments arranged one over the other. The BLs from a top segment may go over a bottom segment in an upper metal layer. Two word lines in the memory device may be activated in one cycle. One IO for 8 or 16 columns, for example, in a conventional systems may become two IOs for the 8 or 16 columns. The height of the IO circuit may become taller, which is desirable for the macro layout floor plan. The WL lengths, for example, of 288 cells may become 144 cells, thus greater efficiency and faster speeds may be allowed with the shorter WL lengths.

The disclosed embodiments may be faster than conventional systems because of the faster WL assertion. This may provide a faster speed, smaller area for multiplexers, a better aspect ratio, and easier timing design for global-Y signals. The disclosed embodiments may include, for example, an SRAM macro device with a flying BL scheme. The memory of the macro may be split into two segments with one being disposed over the other. Two WLs, one in a bottom segment and another in a top segment, may be activated in a cycle.

Figure 1A:
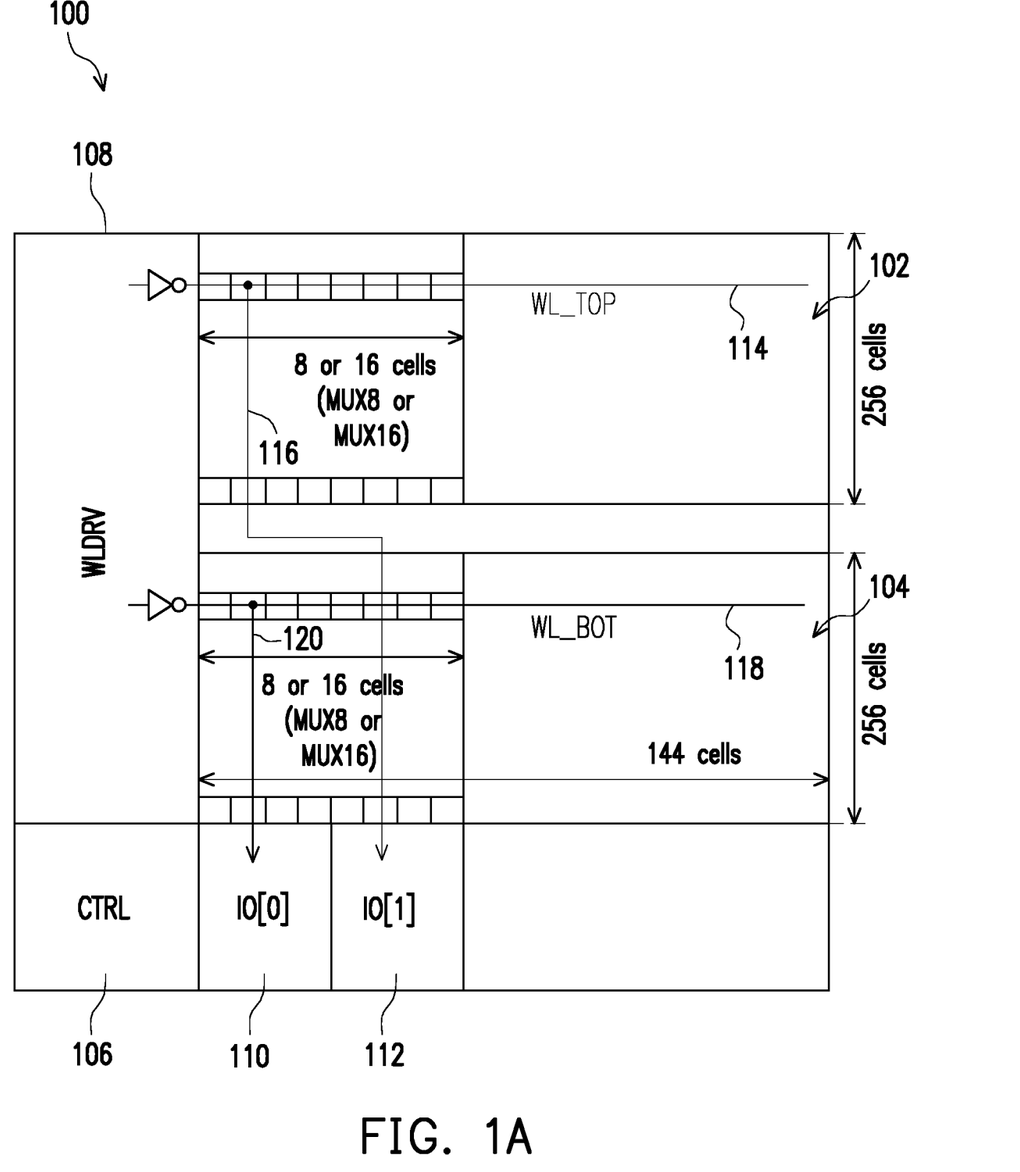
FIG. 1A is a block diagram illustrating an example of a memory macro system in accordance with some embodiments.

FIG. 1A is a block diagram that may illustrate a memory macro system 100 in accordance with some embodiments of the disclosure. As shown in FIG. 1A, memory macro system 100 may comprise a first segment 102, a second segment 104, a control circuit or controller 106, a WL driver circuit 108, and an IO circuitry. The IO circuitry may comprise, for example, a first IO circuit 110 and a second IO circuit 112. Memory contained in first segment 102 and second segment 104 may be controlled and operated by control circuit 106, WL driver circuit 108, and the IO circuitry.

As shown in FIG. 1A, first segment 102 may be placed on top of second segment 104. This may be in contrast to conventional systems where the memory cells are arranged in a single array that is twice as wide as either of segments 102, 104. The conventional configuration uses longer WLs than embodiments of the disclosure. Accordingly, conventional systems have degraded speeds as compared to embodiments of the disclosure due to the conventional systems having longer WLs. Moreover, with conventional systems, an aspect ratio may be realized in which the height of the IO circuitry tends to be shorter than the control circuit. This may cause wasted area on a chip, thus such an aspect ratio is not good for placement on the chip. For example, conventional systems may comprise a memory cell comprising 256 cells by 288 cells.

First segment 102 may comprise a first plurality of memory cells, a first WL 114, and a first BL 116. Similarly, second segment 104 may comprise a second plurality of memory cells, a second WL 118, and a second BL 120. First plurality of memory cells and second plurality of memory cells may comprise, but are not limited to, SRAM cells and Dual Port (i.e., multiport) SRAM cells. Consistent with embodiments of the disclosure, BLs (e.g., first BL 116) from a top segment (e.g., first segment 102) may go over a bottom segment (e.g., second segment 104) in an upper metal layer. First BL 116 from first segment 102 may go over second segment 104 in the upper metal layer, for example, using a "flying BL" scheme.

Two word lines (i.e., a WL_TOP (e.g., first WL 114) and a WL_BOT (e.g., second WL 118)) in memory macro system 100 may be activated in one cycle. For example, one IO for 8 or 16 columns in conventional systems may become two IOs (e.g., first IO circuit 110 and second IO circuit 112) for the 8 or 16 columns with embodiments of the disclosure. The height of the IO circuit with embodiments of the disclosure may become taller as compared to conventional systems, which may be desirable for the layout floor plan of memory macro system 100.

Consistent with embodiments of the disclosure, the WL lengths (i.e., the length of first WL 114 and the length of second WL 118) may become shorter as compared to conventional systems. For example, as shown in FIG. 1A, the WL lengths may be reduced from 288 cells to 144 cells, thus may allow greater efficiency and faster speeds with the shorter WLs provided by embodiments of the disclosure. As such, embodiments of the disclosure may split, for example, a conventional 256×288 memory device into two 256×144 segments arranged one over the other.

Figure 1B:
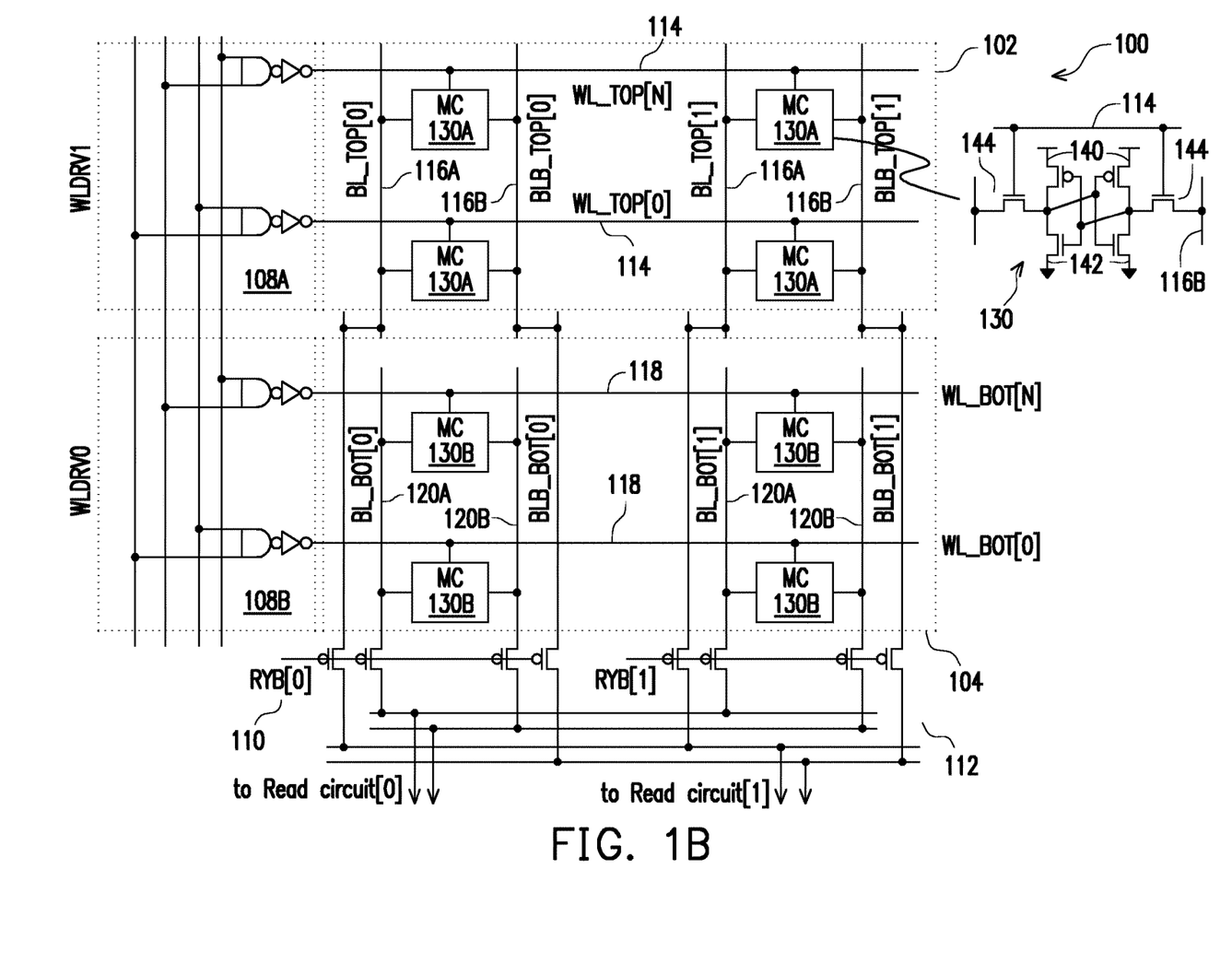
FIG. 1B is a circuit diagram illustrating further aspects of the memory macro of FIG. 1A in accordance with some embodiments.

FIG. 1B is a block diagram illustrating further aspects of the system 100 shown in FIG. 1A in accordance with some examples. As noted above, first segment 102 may comprise a first plurality of memory cells 130A, first WLs 114, and first complementary BLs 116A, 116B. Similarly, second segment 104 may comprise a second plurality of memory cells 130B (first and second memory cells 130A, 130B are collectively referred to herein as memory cells 130), second WLs 118, and second complementary BLs 120A, 120B. First plurality of memory cells 130A and second plurality of memory cells 130B may comprise, but are not limited to, SRAM cells and Dual Port (i.e., multiport) SRAM cells. One example of memory cells 130 is shown in FIG. 1B. The example memory cell 130 in the illustrated example may be a 6T SRAM cell, the structure of which may be the same for both the first plurality of memory cells 130A and the second plurality of memory cells 130B. For simplicity, the example SRAM cell 130 is described in terms of one of first plurality of memory cells 130A. As such, SRAM memory cell 130 is connected to word line 114 and complementary BLs 116A and 116B.

The memory cell 130 includes PMOS transistors 140 and NMOS transistors 142 connected between supply voltage and ground terminals to form cross-coupled inverters. Based on a received memory address, access NMOS transistors 144 selectively connect the outputs of the inverters to the complementary BLs 116A, 116B. WL 114 is connected to gate terminal of access transistors 144 to selectively couple the outputs of the inverters to the BLs 116A, 116B in response to WL select signals transmitted via WLs 114. The cross coupled inverters of memory cell 130 provide two stable voltage states denoting logic values 0 and 1. Metal-Oxide Semiconductor Field Effect Transistors (MOSFETs) are typically used as transistors 140, 142, 144 in memory cell 130. In some embodiments more or fewer than 6 transistors may be used to implement memory cell 130. In the illustrated embodiment, BLs (e.g., first BL 116) from top segment 102 may go over bottom segment 104 in an upper metal layer of the macro 100.

In the example of FIG. 1B, WL driver circuit 108 may include upper and lower WL driver circuits 108A, 108B, configured to output WL select signals in response to a memory address received by the controller 106. Similarly, as also shown in FIG. 1A, IO circuits 110 and 112 correspond to bottom segment 104 and top segment 102, respectively, to receive and transmit read and write data to memory cells 130. In some embodiments, each IO circuit 110, 112 may include data input and data output functionality. For example, top segment 102 may be assigned to odd IO circuits (e.g. IO[1], IO[3], . . . ) and bottom segment 104 may be assigned to even IO circuits (e.g. IO[0], IO[2], . . . ). Both segments 102, 104 may share a common decode scheme. No special BL/WL precharge circuit is required for the illustrated examples.

Figure 2:
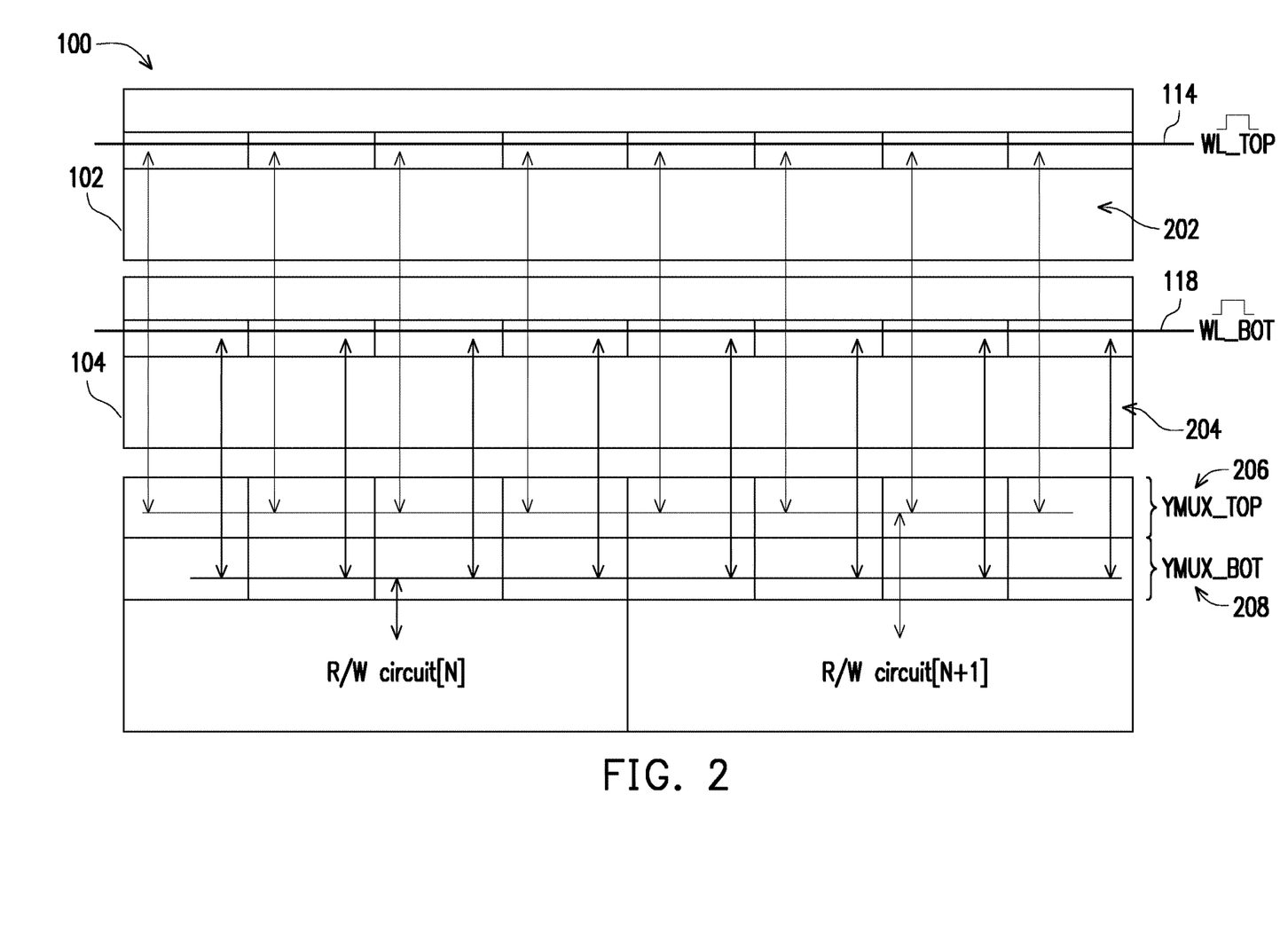
FIG. 2 illustrates an Input/Output (IO) floorplan in accordance with some embodiments.

Two word lines (i.e., a WL_TOP (e.g., first WL 114) and a WL_BOT (e.g., second WL 118)) in memory macro system 100 may be activated in one cycle. For example, both WL driver circuits 108A, 108B may output WL select signals in response to received memory cell addresses. FIG. 2 illustrates an IO floorplan for memory macro system 100 in accordance with some embodiments of the disclosure. As shown in FIG. 2, a first plurality of BLs 202 may include first BL 116 and a second plurality of BLs 204 may include second BL 120. The IO circuitry may include a first plurality of multiplexers 206 corresponding to first segment 102 and a second plurality of multiplexers 208 corresponding to second segment 104. FIG. 2 illustrates that first plurality of multiplexers 206 may be positioned over second plurality of multiplexers 208 in the IO circuitry. First plurality of BLs 202 from first segment 102 may go over second segment 104 in the upper metal layer, for example, using a "flying BL" scheme. As noted previously, in some examples accordingly first or top segment 102 is assigned to odd IO 112 and second or bottom segment 104 is assigned to even IO 110. As such, two columns are activated for a given read/write operation (even IO and odd IO). Moreover, the length of global column select lines of the first and second multiplexers 206, 208 depends on the number of columns. In other words, a large number columns extending across the macro 100 requires column select signals of the column select multiplexers 206, 208 to propagate a longer distance. This may result in larger line resistance and capacitance, possibly impacting timing control. In accordance with disclosed embodiments, providing stacked top segment 102 and bottom segment 104 results in a narrower width from fewer columns. Because the number of columns in the disclosed macro system 100 is smaller, the global column select signals for the first and second multiplexers 206, 208 may travel a shorter distance, improving and simplifying timing design for the global column select signals. In some example implementations, propagation times for WL access signals may improve from about 151.0 ps in a conventional system to about 115.0 ps in the disclosed memory system for a 50 mV signal, and for a 100 mV signal, propagation times may improve from about 211.9 ps in a conventional system to about 189.6.0 ps in the disclosed memory system. Still further, some conventional flying BL arrangements require additional IO components, such as an additional column select multiplexer, requiring additional macro area.

Further, as shown in FIG. 1A, multiplexers 206, 208 in some embodiments may be eight or 16 cell multiplexers. In a conventional memory macro, if the column select multiplexers are eight column multiplexers or more (MUX>=8), the height of the IO cell may be shorter than the height of the control block, possibly resulting in layout difficulty and wasted macro area. As noted above, a conventional 256×288 memory device may be segmented into two 256×144 segments 102, 104. Accordingly, the first and second segments 102, 104 each include half as many multiplexers as a conventional memory device. In other words, if a conventional memory array includes N multiplexers, the disclosed memory macro 100 may include N/2 multiplexers in each of the first and second memory segments 102, 104 (i.e. total multiplexers is N/2×2). The "stacked" multiplexers corresponding to the first and second memory segments 102, 104 may result in an increased IO cell height relative to the control block thus improving macro layout and area utilization.

Figure 3A:
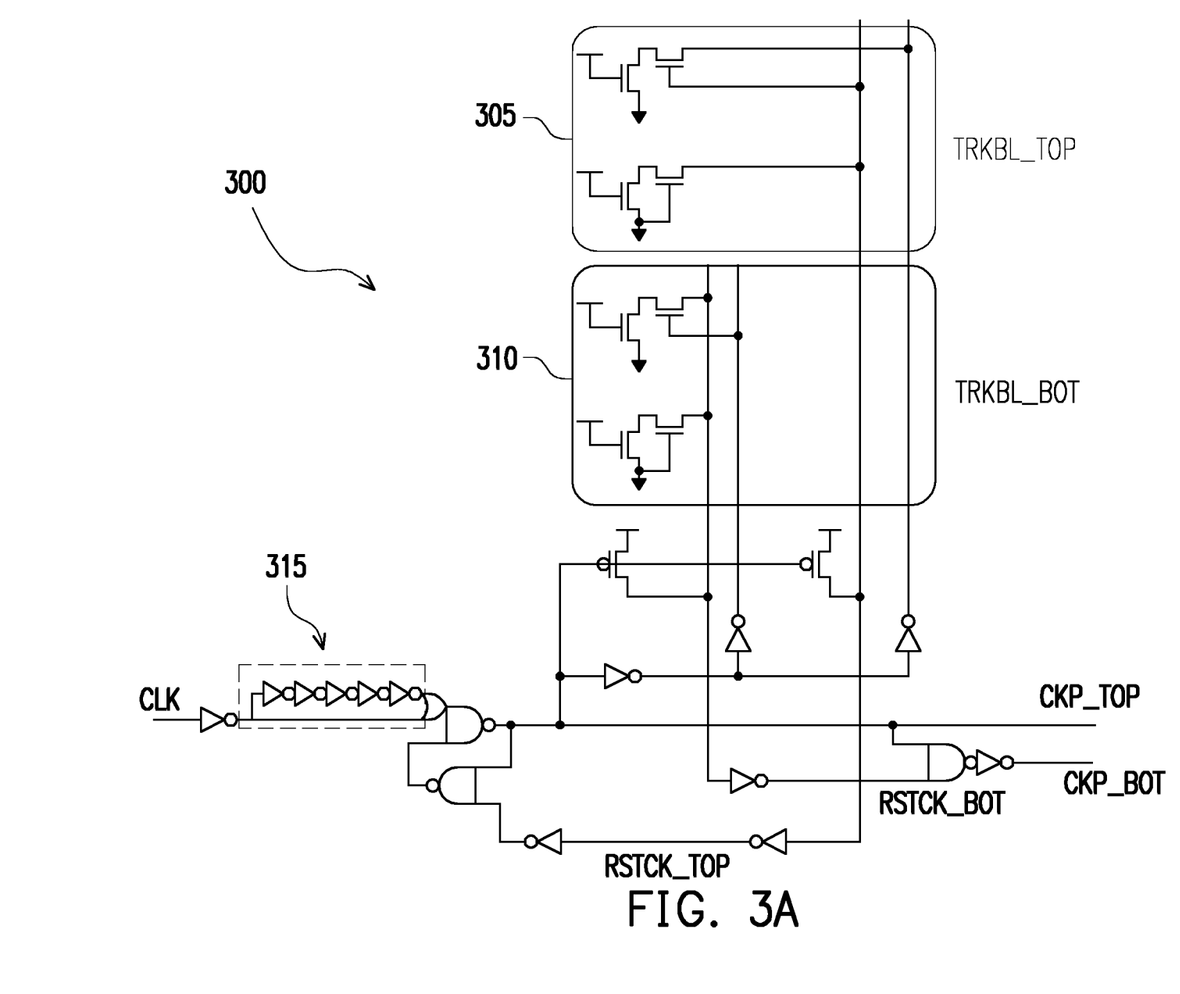
FIG. 3A illustrates a tracking Bit Line (BL) circuit in accordance with some embodiments.

FIG. 3A illustrates a tracking BL circuit 300 in accordance with some embodiments of the disclosure. In some disclosed examples, bottom segment 104 is close to IO circuits 110, 112 and controller 106, while top segment 102 is farther from these components. Accordingly, BL signals propagate faster between bottom segment 104 and IO circuits 110, 112 and controller 106. In accordance with some disclosed embodiments, internal clock pulse widths may be customized for top and bottom segments 102, 104. A shorter clock pulse width may be provided for bottom segment 104, saving power.

Figure 3B:
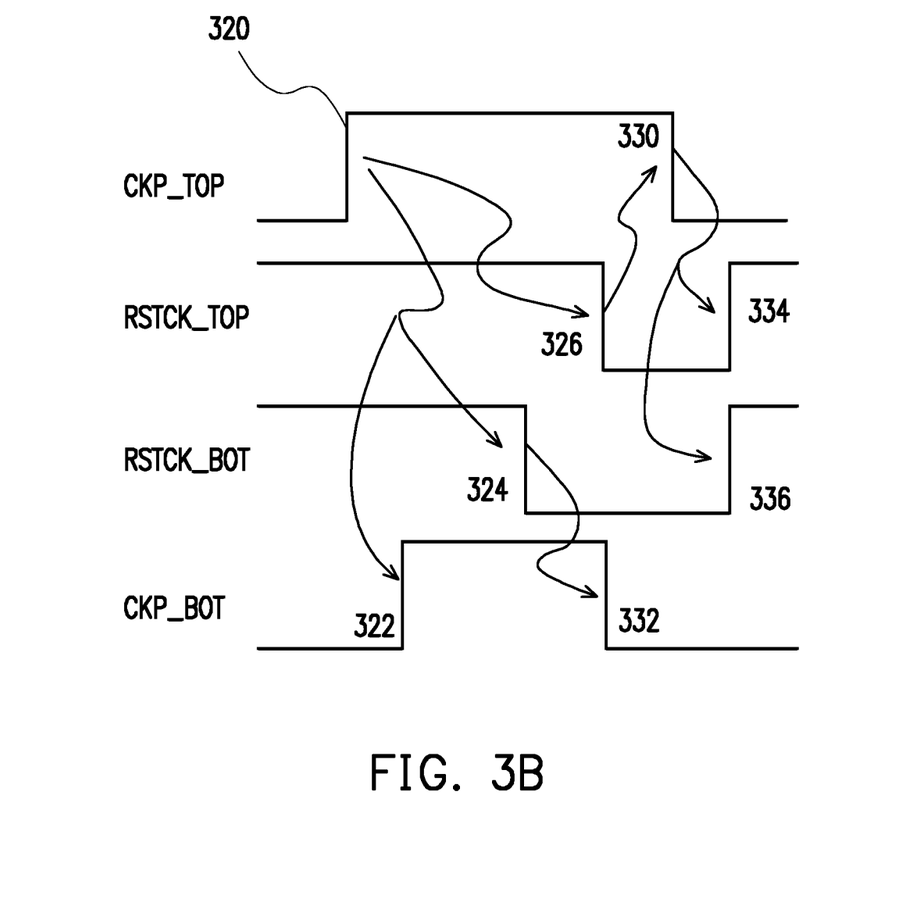
FIG. 3B illustrates example waveforms for the circuit of FIG. 3A.

Tracking BL circuit 300 may comprise a first BL tracking circuit 305, a second BL tracking circuit 310, and a ring oscillator 315 to provide different clock pulse widths for top and bottom segments 102, 104. First BL tracking circuit 305 may correspond to first segment 102 and second BL tracking circuit 310 may correspond to second segment 104. A BL tracking scheme performed for second segment 104 by second BL tracking circuit 310 may be faster than a BL tracking scheme performed for first segment 102 by first BL tracking circuit 305. For example, as shown in FIG. 3B, a pulse width for a bottom clock pulse signal CKP_BOT may be shorter than a pulse width for a top clock pulse signal CKP_TOP, which may save power. Ring oscillator 315 may be configured to add delay in tracking BL circuit 300 to change the pulse width of CKP_BOT as comparted CKP_TOP.

FIG. 3B is an example timing diagram corresponding to the circuit of FIG. 3A. A clock pulse signal CLK is received by ring oscillator 315. The rising clock pulse signal results in the rising edge 320 of CKP_TOP. Following the rising CKP_TOP signal, the CKP_BOT signal transitions at 322, while reset bottom signal RSTCK_BOT and reset top signal RSTCK_TOP transition low as shown at 324, 326, respectively. The falling RSTCK_TOP signal 326 causes CKP_TOP signal to transition to low at 330, and the falling RSTCK_BOT signal 324 results in the CKP_BOT signal going low. Following the falling CKP_TOP signal 330, RSTCK_TOP and RSTCK_BOT signals rise at 334, 336. Thus, as shown in FIG. 3B, the CKP_BOT signal defines a shorter pulse width than the CKP_TOP signal.

Figure 4:
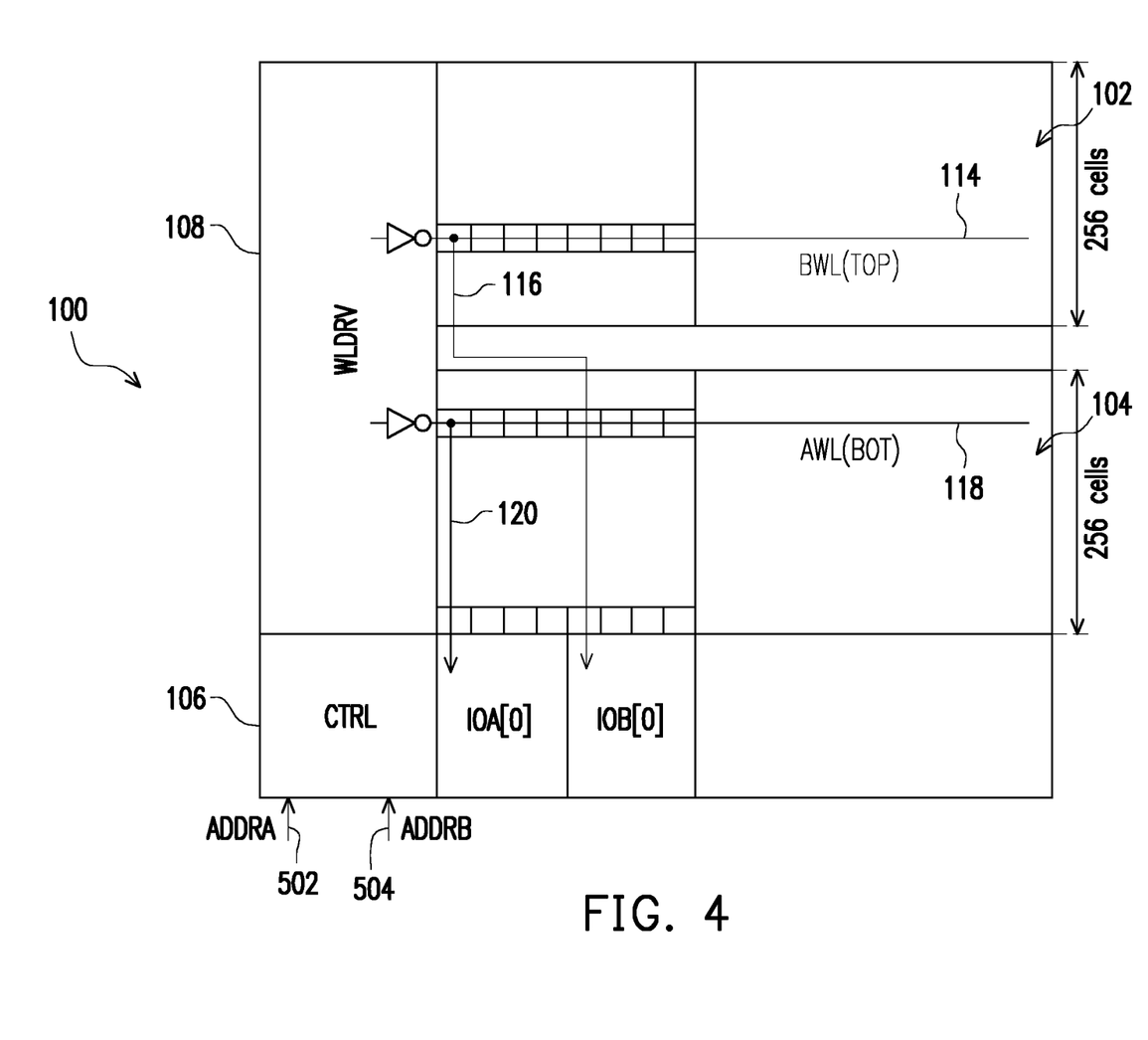
FIG. 4 is a block diagram that may illustrate a memory macro system with separated address inputs in accordance with some embodiments.

FIG. 4 is a block diagram that may illustrate memory macro system 100 with separated address inputs in accordance with some embodiments of the disclosure. In the example shown in FIGS. 1A and 1B, the top and bottom segments 102, 104 may employ identical address decode schemes. As shown in FIG. 4, IOB may correspond to first segment 102 and IOA may correspond to second segment 104. Control circuit 106 may include a first address input 502 that may enable first WL 114 and a second address input 504 that may enable second WL 118. Thus, in FIG. 4, the address decoder of WL driver 108 in top segment 102 is controlled by address B, while the decoder for bottom segment 104 is controlled by address A. This may result in increased address flexibility. In the examples of FIGS. 1A, 1B and 4, WLs 114 and 118 of top segment 102 and bottom segment 104, respectively, may be asserted in a single read or write operation.

Accordingly, embodiments of the disclosure may include address inputs that may be separated for first segment 102 and second segment 104 such that WLs 114 and 118 for top and bottom segments 102, 104 may asserted based on respective address signals in a single memory cycle. Consequently, embodiments of the disclosure may provide control circuit 106 that may be configured to independently address first WL 114 and second WL 118.

Figure 5:
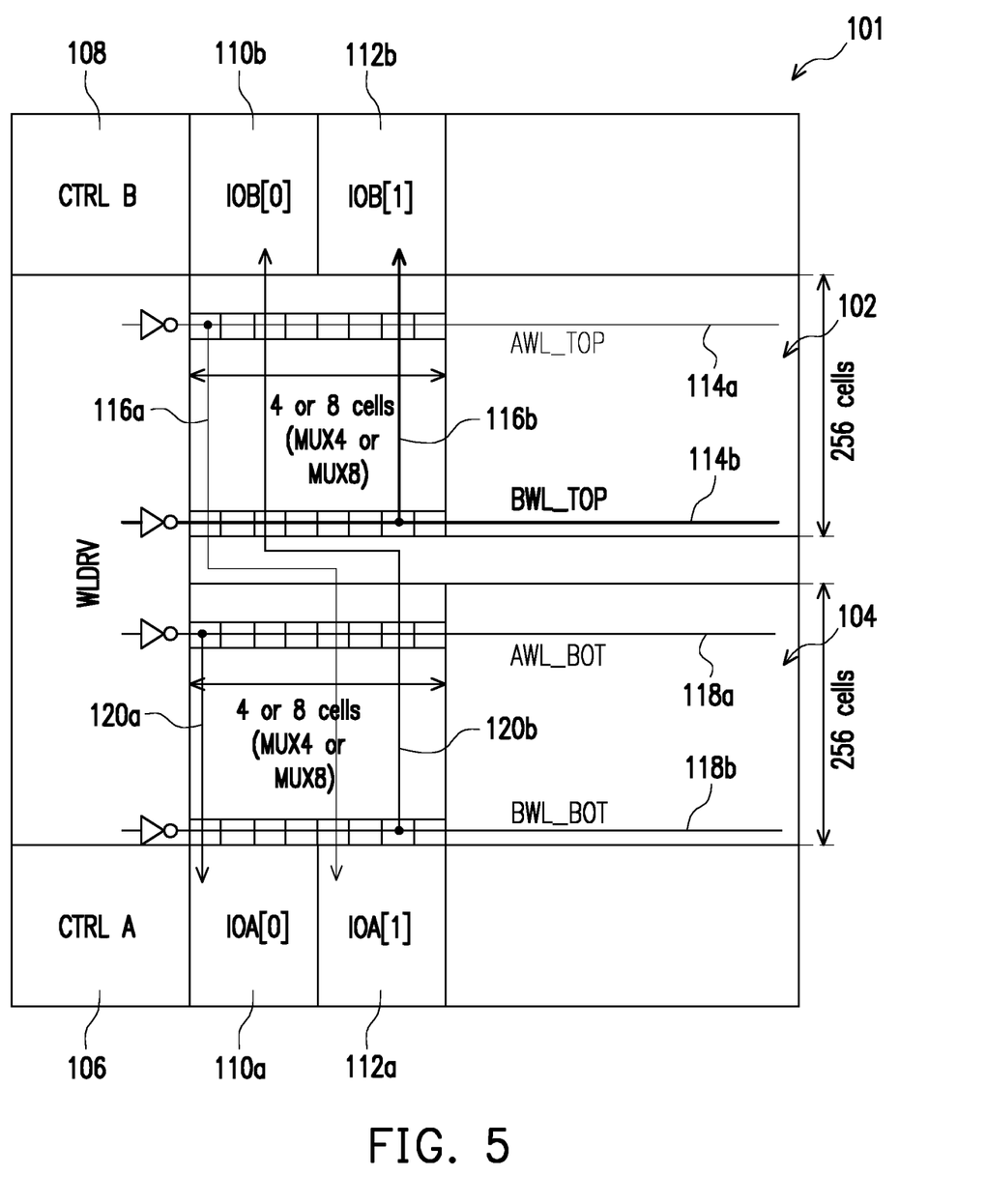
FIG. 5 is a block diagram that may illustrate a memory macro system with multiport Static Random Access Memory (SRAM) in accordance with some embodiments.

FIG. 5 is a block diagram that may illustrate another memory macro system 101 with multiport SRAM in accordance with some embodiments of the disclosure. As shown in FIG. 5, first segment 102 and second segment 104 of memory macro system 101 may comprise Dual Port (DP) SRAM or multiport SRAM. More specifically, as in the example illustrated in FIG. 1, the first segment 102 may be placed on top of second segment 104. First segment 102 may comprise a first plurality of memory cells, a first "A" WL 114a, a first "B" WL 114b, a first "A" BL 116a and a first "B" BL 116b. Similarly, second segment 104 may comprise a second plurality of memory cells, a second "A" WL 118a, a second "B" WL 118b, a second "A" BL 120a and a second "B" BL 120b. Consistent with embodiments of the disclosure, BLs (e.g., first A and B BLs 116a, 116b) from a top segment (e.g., first segment 102) may go over a bottom segment (e.g., second segment 104) in an upper metal layer. First A and B BLs 116a, 116b from first segment 102 may go over second segment 104 in the upper metal layer, for example, using a "flying BL" scheme.

In the example of FIGS. 1A and 1B, memory cells 130 employ a 6T single-port (SP) SRAM configuration. In the embodiment shown in FIG. 5, DP SRAM memory cells may be employed. While general functionality may be essentially similar to a conventional DP SRAM memory, in the example of FIG. 5 four WLs may be activated in a single cycle, since the memory array is separated into first and second segments 102, 104, and the A and B WLs are connected to the dual ports of the DP SRAM memory cells. Thus, the word lines (i.e., two WL_TOP (e.g., first A and B WLs 114a, 114b) and two WL_BOT (e.g., second A and B WLs 118a, 118b)) in memory macro system 101 may be activated in one cycle. The first TO circuit 110 and second IO circuit 112 shown in the example of FIG. 1A for the 8 or 16 columns are replaced with first "A" and "B" TO circuits 110a, 110b, and second "A" and "B" IO circuits 112a, 112b.

Figure 6:
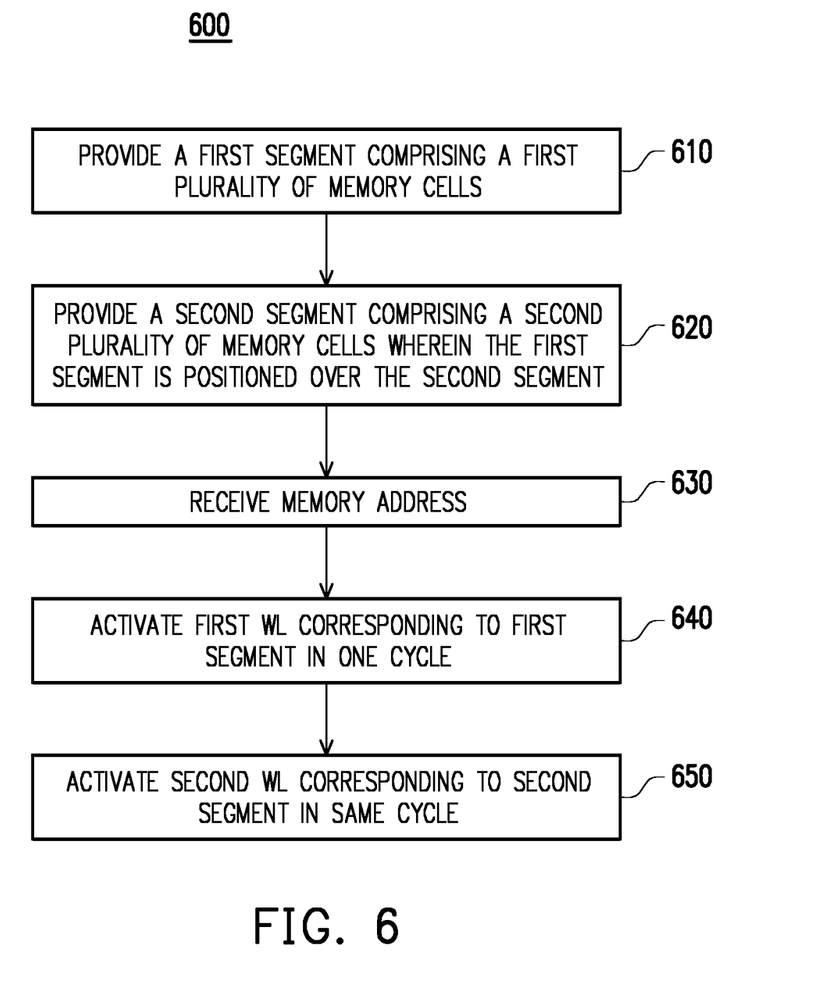
FIG. 6 is a flow chart of a method for providing a multi Word Line (WL) assertion in a flying bitline scheme in accordance with some embodiments.

FIG. 6 is a flow chart setting forth the general stages involved in a method 600 consistent with an embodiment of the disclosure for providing memory macro system 100 including multi WL assertion in a flying bitline scheme. Ways to implement the stages of method 600 will be described in greater detail below.

Illustrated method 600 includes an operation 610 where first segment 102 comprising the first plurality of memory cells 130A may be provided. For example, the first plurality of memory cells may comprise DP SRAM or multiport SRAM. The first plurality of memory cells 130A may be arranged, for example, in 144 columns and 256 rows.

From the operation 610, where first segment 102 comprising the first plurality of memory cells 130A is provided, illustrated method 600 advances to an operation 620 where second segment 104 comprising the second plurality of memory cells 130B may be provided. The second plurality of memory cells 130A may comprise DP SRAM or multiport SRAM. The second plurality of memory cells may be arranged, for example, in 144 columns and 256 rows. For example, first segment 102 may be positioned over second segment 104. First BL 116 from first segment 102 may go over second segment 104 in the upper metal layer, for example, using a "flying BL" scheme.

Once second segment 104 comprising the second plurality of memory cells is provided in operation 620, method 600 may continue to an operation 630 where a memory address is received, such as by the control circuit 106. In an operation 640, a first WL 114 corresponding to the first segment 102 is activated based on the memory address. Further, in an operation 650, a second WL 118 corresponding to the second segment 104 is activated based on the memory address. In the illustrated method 600, the first WL 114 and the second WL 118 are activated in one cycle. For example, embodiments of the disclosure may provide greater efficiency and faster speeds over conventional systems because the lengths of first WL 114 and second WL 118 are shorter than one long conventional WL.

Embodiments of the disclosure may split a conventional memory device into two segments arranged one over the other. The BLs from a top segment may go over a bottom segment in an upper metal layer in a flying BL scheme. Two word lines corresponding to both the first segment and the second segment in the memory device may be activated in one cycle. Because the WL lengths of embodiment of the disclosure may become shorter, embodiment of the disclosure may provide greater efficiency and faster speeds over conventional systems with the shorter WLs.

An embodiment of the disclosure may comprise a memory macro system. The memory macro system may comprise a first segment, a second segment, a first WL, and a second WL. The first segment may comprise a first plurality of memory cells. The second segment may comprise a second plurality of memory cells. The first segment may be positioned over the second segment. The first WL may correspond to the first segment and the second WL may correspond to the second segment. The first WL and the second WL may be configured to be activated in one cycle.

Another embodiment of the disclosure may comprise a memory macro system. The memory macro system may comprise a first segment, a second segment, and a first BL. The first segment may comprise a first plurality of memory cells. The second segment may comprise a second plurality of memory cells. The first segment may be positioned over the second segment. A plurality of first BLs is coupled to the first plurality of memory cells, and a plurality of second BLs is coupled to the second plurality of memory cells. The first BL may go over the second segment in a flying BL scheme. A first multiplexer is coupled between the plurality of first BLs and a first IO circuit, and a second multiplexer is coupled between the plurality of second BLs and a second IO circuit. Yet another embodiment of the disclosure may comprise a method in which a first segment comprising a first plurality of memory cells is provided. In addition, embodiments of the disclosure may comprise providing a second segment comprising a second plurality of memory cells wherein the first segment is positioned over the second segment. A memory address is received, and a first WL corresponding to the first segment is activated based on the memory address. Additionally, a second WL corresponding to the second segment is activated based on the memory address. Moreover, the first WL and the second WL may be configured to be activated in one cycle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first segment comprising a first plurality of memory cells;
   a second segment comprising a second plurality of memory cells wherein the first segment is positioned over the second segment;
   a first Bit Line (BL) corresponding to the first segment wherein the first BL goes over the second segment in a flying BL scheme;
   a first Word Line (WL) corresponding to the first segment; and
   a second WL corresponding to the second segment wherein the first WL and the second WL are configured to be activated in one cycle.

2. The apparatus of claim 1, further comprising a WL driver configured to drive the first WL and the second WL.

3. The apparatus of claim 1, further comprising a control circuit.

4. The apparatus of claim 3, wherein the control circuit is configured to independently address the first WL and the second WL.

5. The apparatus of claim 1, further comprising:
   a first Input Output (IO) circuit corresponding to the first segment; and
   a second IO circuit corresponding to the second segment.

6. The apparatus of claim 5, wherein the first IO circuit further comprises:
   a first plurality of multiplexers corresponding to the first segment; and
   a second plurality of multiplexers corresponding to the second segment wherein the first plurality of multiplexers is positioned over the second plurality of multiplexers.

7. The apparatus of claim 5, wherein the second IO circuit further comprises:
   a first plurality of multiplexers corresponding to the first segment; and
   a second plurality of multiplexers corresponding to the second segment wherein the first plurality of multiplexers is positioned over the second plurality of multiplexers.

8. The apparatus of claim 1, wherein the first plurality of memory cells and the second plurality of memory cells comprise Static Random Access Memory (SRAM).

9. The apparatus of claim 1, wherein the first plurality of memory cells and the second plurality of memory cells comprise Multiport SRAM.

10. The apparatus of claim 1, further comprising a tracking BL circuit comprising:
    a first BL tracking circuit corresponding to the first segment; and
    a second BL tracking circuit corresponding to the second segment wherein a BL tracking scheme performed for the second segment by the second BL tracking circuit is faster than a BL tracking scheme performed for the first segment by the first BL tracking circuit.

11. The apparatus of claim 1, wherein the first plurality of memory cells are arranged in 144 columns and 256 rows.

12. The apparatus of claim 1, wherein the second plurality of memory cells are arranged in 144 columns and 256 rows.

13. An apparatus comprising:
    a first segment comprising a first plurality of memory cells;
    a second segment comprising a second plurality of memory cells, wherein the first segment is positioned over the second segment;
    a plurality of first Bit Lines (BLs) coupled to the first plurality of memory cells;
    a plurality of second BLs coupled to the second plurality of memory cells, wherein the first BLs goes over the second segment in a flying BL scheme;
    a first multiplexer coupled between the plurality of first BLs and a first 10 circuit; and
    a second multiplexer coupled between the plurality of second BLs and a second IO circuit.

14. The apparatus of claim 13, further comprising:
    a first Word Line (WL) corresponding to the first segment; and
    a second WL corresponding to the second segment wherein the first WL and the second WL are configured to be activated in one cycle.

15. The apparatus of claim 14, further comprising a control circuit configured to independently address the first WL and the second WL.

16. The apparatus of claim 13, wherein the first multiplexer and the second multiplexer are in a stacked configuration.

17. A method comprising:
    providing a first segment comprising a first plurality of memory cells;
    providing a second segment comprising a second plurality of memory cells wherein the first segment is positioned over the second segment;
    providing a first Bit Line (BL) corresponding to the first segment wherein the first BL goes over the second segment in a flying BL scheme;
    receiving a memory address;
    activating a first Word Line (WL) corresponding to the first segment based on the memory address;
    activating a second WL corresponding to the second segment based on the memory address;
    wherein the first WL and the second WL are activated in one cycle.

18. The method of claim 17, wherein receiving the memory address comprises receiving first and second memory addresses.

19. The method of claim 18, wherein the first WL is activated based on the first memory address, and the second WL is activated based on the second memory address.

* * * * *